(12) United States Patent
Gambin et al.

(10) Patent No.: US 10,811,601 B2
(45) Date of Patent: Oct. 20, 2020

(54) SEMICONDUCTOR DEVICES USING INSULATOR-METAL PHASE CHANGE MATERIALS AND METHOD FOR FABRICATION

(71) Applicant: Northrop Grumman Systems Corporation, Falls Church, VA (US)

(72) Inventors: Vincent Gambin, Rancho Palos Verdes, CA (US); Rachel A. Koltun, Hermosa Beach, CA (US); Benjamin Heying, Fullerton, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/254,218

(22) Filed: Jan. 22, 2019

(65) Prior Publication Data

US 2020/0235293 A1    Jul. 23, 2020

(51) Int. Cl.
*H01L 45/00* (2006.01)
(52) U.S. Cl.
CPC .......... *H01L 45/1206* (2013.01); *H01L 45/06* (2013.01); *H01L 45/1226* (2013.01); *H01L 45/1253* (2013.01); *H01L 45/144* (2013.01)
(58) Field of Classification Search
CPC ....... H01L 45/00; H01L 45/06; H01L 45/144; H01L 45/1206; H01L 45/1226; H01L 45/1253; H01L 45/065; H01L 45/141; H01L 45/142; H01L 45/143; H01L 45/1608; H01L 45/1246; H01L 45/1233; G11C 13/0038; G11C 13/0004; G11C 13/0069; G11C 13/0016; G11C 13/0007; G11C 2013/0092; G11C 2013/0083; G11C 2013/009; G11C 2213/15; G11C 2213/54; G11C 11/56
USPC ........................................................ 257/4, 42
See application file for complete search history.

(56) References Cited

U.S. PATENT DOCUMENTS

| 2006/0120148 A1* | 6/2006 | Kim .................. G11C 13/0004 365/163 |
| 2007/0148839 A1 | 6/2007 | Yudasaka |
| 2014/0110765 A1 | 4/2014 | Murali et al. |

(Continued)

FOREIGN PATENT DOCUMENTS

EP    0 587 520    3/1994

OTHER PUBLICATIONS

International Search Report and Written Opinion in related PCT Application No. PCT/US2019/062377, dated Jan. 31, 2020, 17 pages.

(Continued)

*Primary Examiner* — Chuong A Luu
(74) *Attorney, Agent, or Firm* — McCracken & Gillen LLC

(57) ABSTRACT

An exemplary semiconductor incorporates phase change material $Mo_xW_{1-x}Te_2$ that may be the semiconducting channel or may be part of a control terminal/gate of the semiconductor. The phase change material selectably being in one of metal and insulator phases depending on whether a voltage field greater than a predetermined phase change field is present at the phase change material. The properties of the semiconductor are varied depending on the phase of the phase change material.

7 Claims, 4 Drawing Sheets

(56) References Cited

U.S. PATENT DOCUMENTS

2019/0016906 A1* 1/2019 Seol .................. G03F 7/168

OTHER PUBLICATIONS

Zhang Feng et al, Electric-field induced structural transition in vertical $MoTe_2$- and $Mo_{1-x}W_xTe_2$-based resistive memories, Nature Materials, vol. 18, Jan. 2019, pp. 55-61.

Nihar R. Pradhan et al, Field-Effect Transistors Based on Few-Layered $\alpha$-$MoTe_2$, ACS Nano, vol. 8, No. 6, Jun. 24, 2014, pp. 5911-5920.

Suyeon Cho et al, Applications of metal-semiconductor phase transition in 2D layered transition metal dichalcogenides, Vacuum Magazine, vol. 3, Mar. 30, 2016, pp. 4-8.

Junku Liu et al, Conversion of Multi-layered $MoTe_2$ Transistor Between P-Type and N-Type and Their Use in Inverter, Nanoscale Research Letters, vol. 13, No. 1, Sep. 21, 2018, pp. 1-9.

D. Rhodes et al., "Engineering the Structural and Electronic Phases of $MoTe_2$ through W Substitution", Nano Letters, vol. 17, No. 3, Feb. 6, 2017, pp. 1616-1622.

Zewei Shao et al: "Recent progress in the phase-transition mechanism and modulation of vanadium dioxide materials", NPG Asia Materials, vol. 10, No. 7, Jul. 1, 2018, pp. 581-605.

* cited by examiner

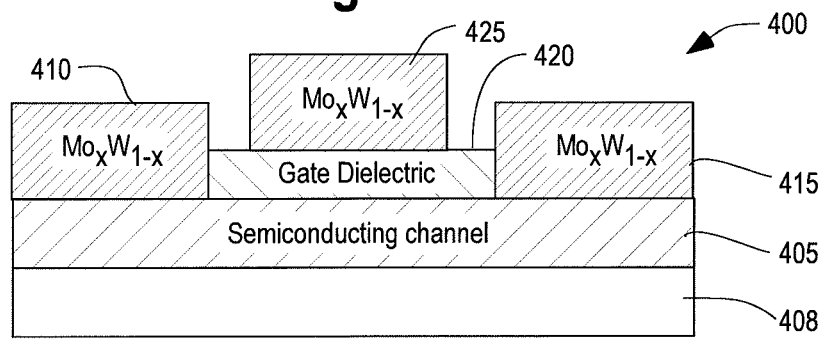
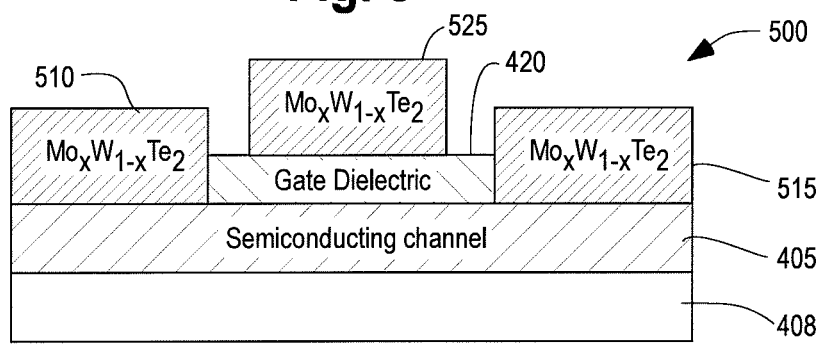
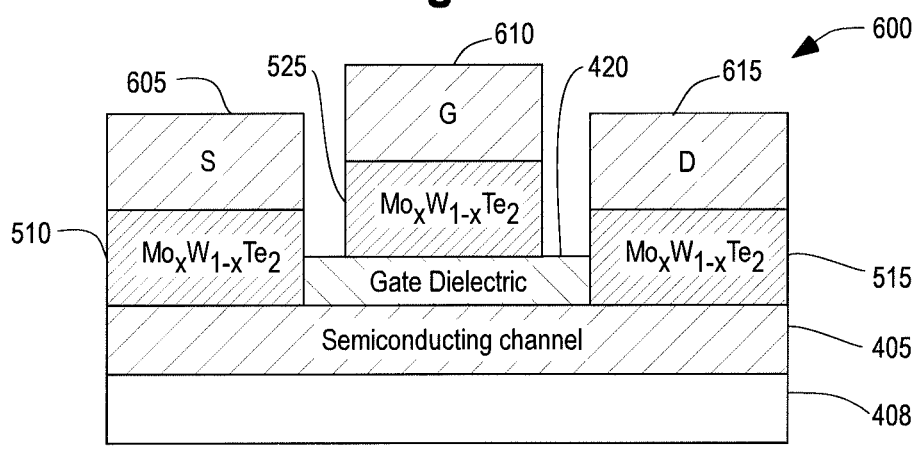

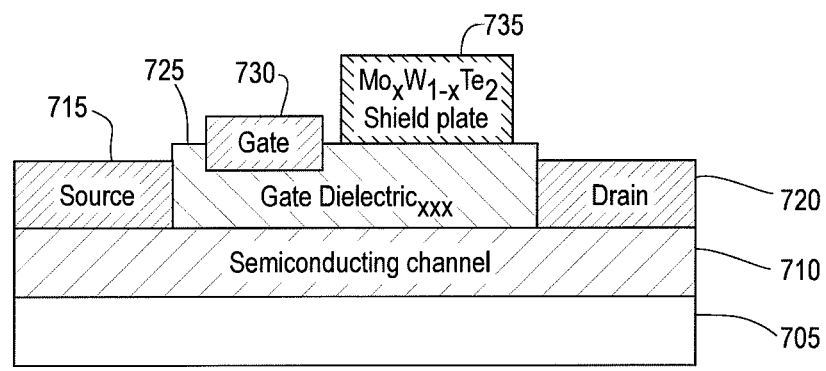
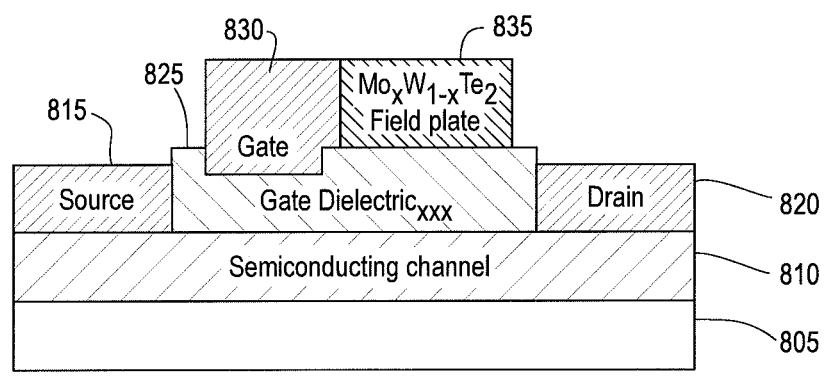

SEMICONDUCTOR DEVICES USING INSULATOR-METAL PHASE CHANGE MATERIALS AND METHOD FOR FABRICATION

BACKGROUND

Embodiments of this invention relate generally to semiconductor devices and more specifically to semiconductor devices using a region/layer of insulator/semiconductor phase change material with an electric field controllable phase change between semiconductor and metal phases at room temperature.

Materials that change between semiconductor and metal phases in response to substantial temperature or pressure changes are known. These carry the obvious constraint of having to operate at temperatures/pressures different from room temperature/ambient atmospheric pressure in order to induce and/or facilitate the change of phase between semiconductor and insulator states.

SUMMARY

One object of embodiments of the present invention is to provide a semiconductor with a room temperature controllable phase change between metal (conducting) and insulating phases that can be easily incorporated into current large-scale semiconductor fabrication.

Another object is to provide an embodiment that is compatible with common silicon large scale manufacturing of semiconductors.

An exemplary semiconductor incorporates phase change material $Mo_xW_{1-x}Te_2$ that may be the semiconducting channel or may be part of a control terminal/gate. The phase change material is controllably in one of metal and insulator phases depending on whether a voltage field greater than a predetermined electric field is present across the phase change material. The physical properties, especially the electrical conductivity or lack of conductivity, of the material change substantially depending on the phase of the phase change material.

In one exemplary embodiment of a semiconductor switch, the phase change material is used for the semiconducting channel where an ON state corresponds to the phase change material being in the metal phase and an OFF state corresponds to the phase change material being in the insulator phase. An externally controllable voltage differential applied across the semiconducting channel generates a field that controls the phase of the phase change material.

In another exemplary embodiment, a field effect transistor (FET) has a semiconducting channel with spaced apart source and drain regions on its surface. A dielectric layer is disposed on the surface of the semiconducting channel between the source and drain regions, and a gate region is disposed on an opposing surface of the dielectric layer, the gate region being disposed between the source and drain regions. The source, gate and drain regions each comprising $Mo_xW_{1-x}Te_2$ phase change material with metal contacts disposed on each to facilitate electrical connections. An externally controllable voltage differential generates a field applied to at least some of the phase change materials to control the phase of the phase change material.

In a further exemplary embodiment, an FET includes an additional control terminal disposed between the gate and the drain where the additional control terminal is made of $Mo_xW_{1-x}Te_2$ phase change material. An externally controllable voltage differential generates a field applied to the phase change material to control the phase of the phase change material between metal and insulator phases. The additional control terminal in the semiconductor phase functioning as a shield to passivate traps at the surface of the semiconducting channel between the gate region and the drain region. The additional control terminal in the insulator phase enhances high frequency response of the FET by not presenting a physically active region adjacent the gate region.

DESCRIPTION OF THE DRAWINGS

Features of exemplary implementations of embodiments of the invention will become apparent from the description, the claims, and the accompanying drawings in which:

FIG. 4 is a representative side view of an embodiment in accordance with the present invention illustrating one point in the fabrication process.

FIG. 5 is a representative side view at a processing step later than that represented in FIG. 4.

FIG. 6 is a representative side view illustrating completion of the fabrication of the embodiment shown in FIG. 4.

FIG. 7 is a representative side view illustrating another embodiment in accordance with the present invention FIG. 8 is a representative side view illustrating a further embodiment in accordance with the present invention.

DETAILED DESCRIPTION OF EXEMPLARY EMBODIMENTS

Figure 1:
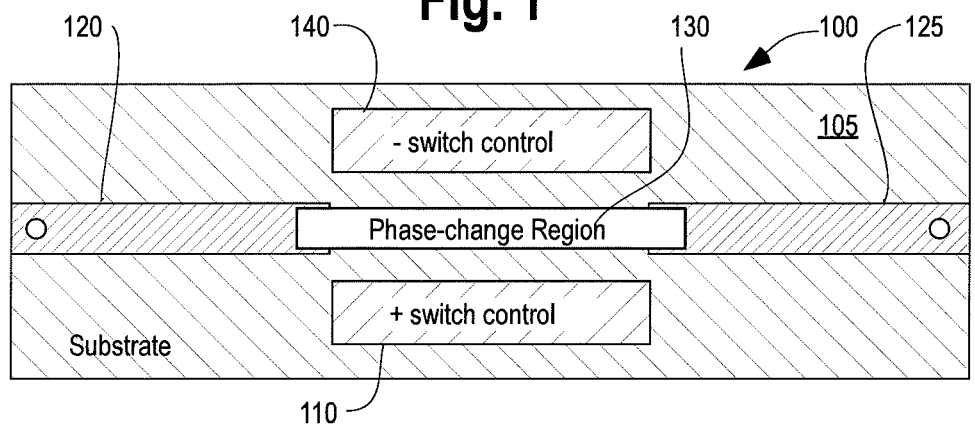
FIG. 1 is a top view of an embodiment of a representative semiconductor device in accordance with the present invention.

FIG. 1 shows a top view of an embodiment of a representative semiconductor switch device 100. A conventional substrate 105, e.g. a silicon, GaAs, InP, SiC, sapphire substrate, such as commonly used in the manufacture of field effect transistors (FETs), has disposed thereon a metallic regions 110 and 140. Metallic contacts/interconnects 120 and 125 are disposed on the top surface of the substrate and serve to provide conductive connections with the left and right end portions of the phase change region 130 which is disposed as a longitudinal strip on the top surface of the substrate between interconnects 120 and 125. The metallic regions 110 and 140 do not contact and are electrically isolated from the phase change region 130. The regions 110 and 140 facilitate the selectable application of a voltage across the phase change region 130 to control whether the phase change material is in the metal or insulating phase which corresponds to current flow or no current flow from contact 120 to contact 125.

Metallic regions 110 and 140 provide a spaced apart sandwich with the lateral sides of the phase change region 130. Metallic regions 110 and 140 function effectively as respective positive and negative voltage plates of a capacitor with presence/absence of the electric field there between controlling the ON/OFF operation of the switch 100, such as when a predetermined voltage equal to or greater than the required phase change voltage is or is not applied across the plates by a voltage source (not shown), e.g. a DC or AC voltage source. The electric field developed between the plates when the predetermined voltage is applied provides sufficient energy via the corresponding electric field to cause the phase change region to change from one of an insulator and metal phase to the other phase. When no voltage (or a voltage less than required phase change voltage) is applied to the plates, the other phase is present. The phase change material can be fabricated to have a stable static state of either the insulator phase or the metal phase. The insulator phase corresponds to the switch being OFF and the metal phase corresponds to the switch being ON. This operation of the switch 100 occurs while the switch temperature remains substantially constant at about room temperature and requires no pressure change to facilitate the switch operation.

The phase change region 130 preferably consists of $Mo_xW_{1-x}Te_2$ which can change between an insulator and metal phase based on the presence or absence of an electric field produced by a voltage differential of a few volts, e.g. about 0.5 to 5 volts. This operation does not require a change of temperature or change of pressure. Effective operation of the switch 100 is possible using $Mo_xW_{1-x}Te_2$ where the x in the formula varies between 0.66 and 1.0. The ratio between Mo and W as well as the distance between the control electrodes determines the electric field required to cause a phase change.

Figure 2:
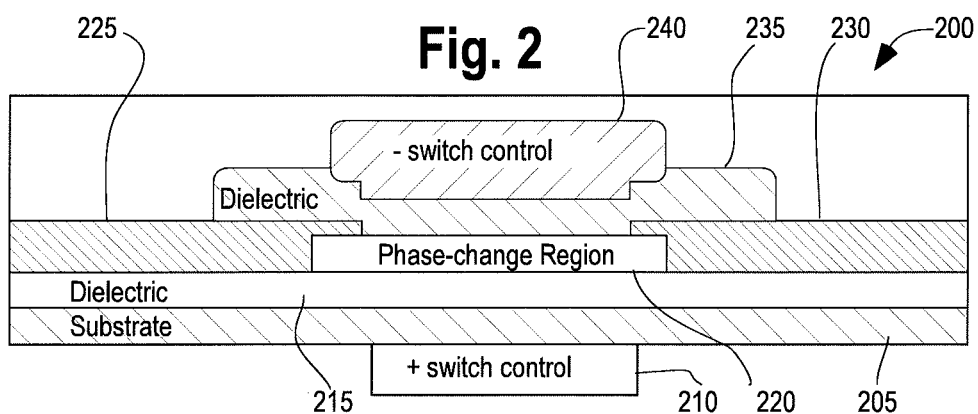
FIG. 2 is a side view of another embodiment of a semiconductor device in accordance with the present invention.

FIG. 2 is a side view of another exemplary embodiment of a switch 200 in accordance with the present invention. On substrate 205 is disposed a metallic switch control contact 210. A dielectric layer 215 covers the top surface of the substrate 205. A region 220 of phase change material is disposed on the top surface of the dielectric 215 substantially opposite the switch control contact 210. Conductive interconnects 225 and 230 connected the respective left and right in regions of the phase change material 220. These interconnects provide conductivity and facilitate the connection of the switch 200 as an element in a circuit with external components (not shown). A dielectric layer 235 is disposed over the top surface of the phase change region 220 and provides a support for metallic switch control contact 240. Similar to the operation explained for the embodiment of FIG. 1, an electric field induced by a voltage connected across switch control contacts 210 and 240 can be utilized to control the phase of the phase change material 220 which in turn determines if the switch will be in the ON state if in the metal phase or will be in the OFF state if in the insulating phase. The switch control contacts form a sandwich with the phase change region 220 therebetween.

Figure 3:
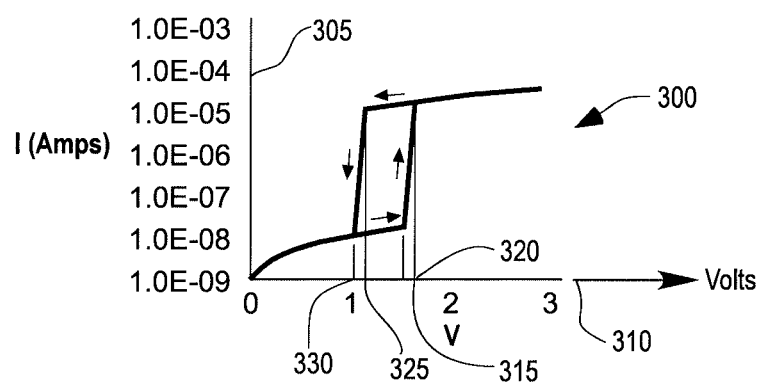
FIG. 3 is a graph illustrating an exemplary change of current flow versus changes in a control voltage.

FIG. 3 shows a graph 300 illustrating an exemplary change of current flow on the y-axis 305 versus changes in a control voltage on the x-axis 310 for a semiconductor 100 where the change of phase of $Mo_xW_{1-x}Te_2$ is used to control the OFF/ON states of the semiconductor. For this example, the x in $Mo_xW_{1-x}Te_2$ may be between 1 and 0.66.

Starting with a control voltage of 0 and increasing to a voltage at 315 (about 0.5-5 volts), the current flow through the respective device has a moderate increase of about 1 decade, i.e. 10 times, to just over 1E-08 amperes. However, a very small further increase in the control voltage from 315 to 320 (about a 30-50 millivolts change) causes over a 3 decade increase in current flow to about 1E-05 amperes. Further increases in the control voltage result in only marginal additional current flow as shown.

Starting with a control voltage of above 320 and decreasing to a voltage at 325, the current flow through the respective device has a moderate decrease of current flow as shown. However, a very small further decrease in the control voltage from 325 to 330 (about a 30-50 millivolts change) causes over a 3 decade decrease in current flow to about 1E-08 amperes. Further decreases in the control voltage result in a further current flow decrease of about 1 decade to 1E-09 amperes as shown. It will be apparent that a hysteresis loop as shown exists between OFF/ON and ON/OFF phase transitions.

It is important to understand that switches/transistors as described in these embodiments provide very steep switching transitions of about 30-50 millivolts ($V_{GS}$ or voltage across switch 100)/decade of current change (IDs or current flow through the phase change region in switch 100). This offers a substantial improvement of higher speeds of switching state transitions as compared with the switching transition of a conventional silicon FET which has a switching transition of greater than 60 millivolt/decade of current change. As will be understood by those skilled in the art, a faster switching time for a device also corresponds in the analog frequency domain to improved higher frequency performance such as when such a device is utilized as an analog RF amplifier.

FIGS. 4, 5 and 6 show side views of an embodiment a semiconductor device utilizing $Mo_xW_{1-x}Te_2$ illustrating the semiconductor device 400, 500 and 600, respectively, at different steps in a fabrication process. As seen at the processing step in FIG. 4, the embodiment 400 includes a semiconducting channel 405 of a typical semiconductor such as Si, GaAs, InGaAs, or GaN disposed on a substrate 408 such as Si, GaAs, InP, sapphire and SiC. A source region 410 and a spaced apart drain region 415 are deposited on the top surface of the semiconducting channel 405. A dielectric 420 is disposed on the top of the semiconducting channel 405 between the source and drain. A gate region 425 is deposited on top of the dielectric 420 between and not engaging the source and drain regions. The source, gate and drain regions are each formed by depositing alloy metals Mo and W as $Mo_xW_{1-x}$. These metals can either be co-deposited or a superlattice can be formed, i.e. thin films of the combination repeated one after another. The choice of "x" in the composition is one factor in controlling the magnitude of the electric field needed to cause a phase change.

In an exemplary embodiment, the source is fabricated to require a lower magnitude electric field, to cause a phase transition, e.g. a higher W concentration such as 0.2-0.3 with respective x values of 0.8-0.7. The gate may be fabricated to require a higher magnitude electric field to cause the phase transition, e.g. a W concentration such as 0-0.1 with corresponding X values of 1-0.9. The drain may be fabricated to require a higher magnitude electric field to cause the phase transition utilizing the same ratios described for the gate.

FIG. 5 shows the semiconductor device 500 that results from the semiconductor device 400 having the source 410, gate 425 and the drain 415 exposed to a vaporized concentration of Te. The vapor of Te is preferably deposited at an elevated temperature of 400-1200° C. which will determine the phase at room temperature with no electric field applied. With Te having been fully reacted, the semiconductor device 500 will have a source 510, gate 525 and drain 515.

FIG. 6 shows the semiconductor device 600 in which conventional metal layers/pads 605, 610 and 615 are deposited respectively on the source 510, gate 525 and drain 515. These metal layers facilitate the attachment/bonding of wires/runners to the respective terminals of the semiconductor device 600 in order to connect the device to external circuitry. Thus, semiconductor device 600 illustrates a completed, fabricated device ready for operation as a steep transition digital switch or in an analog mode as a high-frequency amplifier.

FIG. 7 shows a side view of another embodiment 700 of a semiconductor in accordance with the present invention. The semiconductor 700 represents a conventional semiconductor FET improved with a modification as will be explained. A conventional substrate 705 has disposed thereon a semiconducting channel 710. A conventional source 715 and spaced apart drain 720 are disposed on top of the semiconducting channel 710. Between the source and drain is disposed a gate dielectric 725 onto which the metallic gate 730 is deposited between the source and drain, and typically closer to the source than the drain. A layer of phase change material 735 is deposited on top of the gate dielectric 725 spaced apart between the gate 730 and the drain 720. During operation, the changing electric field between the gate and drain will cause the phase change layer 735 made of $Mo_xW_{1-x}Te_2$ to convert between metal and insulator. In the metal phase this extended shield plate will screen traps that can form between the gate and drain, as designated by xxx in the figure. In the insulating phase the shield plate 735 is no longer electrically conducting and avoids parasitic short channel effects typically seen when using a fully metallic shield plate layer between gate and drain.

FIG. 8 shows a side view of another embodiment 800 of a semiconductor in accordance with the present invention. The semiconductor 800 represents a conventional FET improved with another modification as will be explained. A conventional substrate 805 has disposed thereon a semiconducting channel 810. A conventional source 815 and spaced apart drain 820 are disposed on top of the semiconducting channel 810. Between the source and drain is disposed a gate dielectric 825 onto which the metallic gate 830 is deposited between the source and drain, and typically closer to the source than the drain. A layer of phase change material 835 is deposited on top of the gate dielectric 825 connected to the edge of the gate 830 closest to the drain and extending laterally towards, but not engaging, the drain 820. A field applied between the gate and drain region can be utilized to turn the gate extension, provided by the phase change material 835, ON and OFF. In the OFF state the phase change material functions as an insulator making the effective area of the gate only the area occupied by gate 830 which is physically short providing for improved high-frequency response. In the ON state the phase change material functions as a metal that makes the effective gate the combined combination of gate 830 and phase change material 835 providing a longer effective gate in which the phase change extension functions as a shield trap at the channel surface improving breakdown and mitigating short channel effects.

Figure 9:
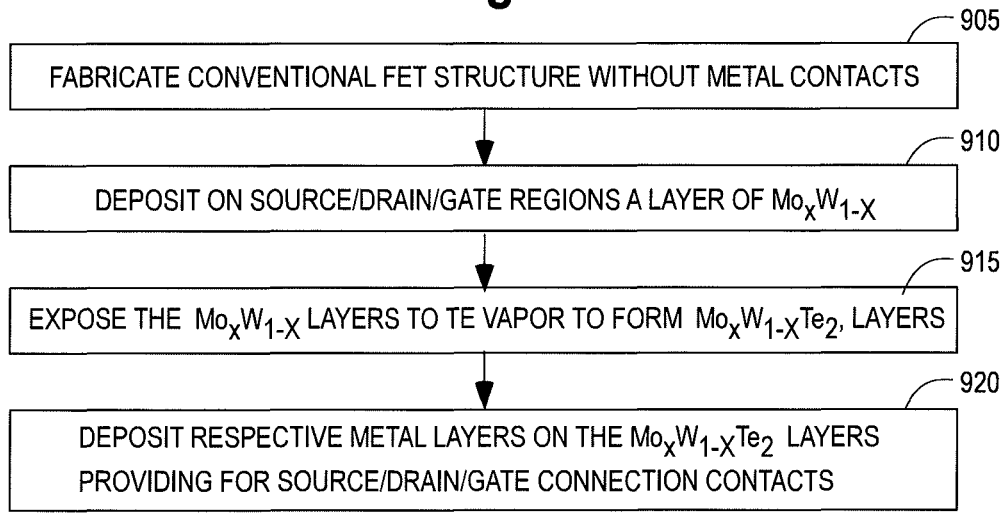
FIG. 9 is a flow diagram illustrating steps in the fabrication of an embodiment in accordance with the present invention.

FIG. 9 shows a flow diagram illustrating steps in the fabrication of an embodiment of a FET semiconductor in accordance with the present invention. In step 905 a conventional semiconductor FET structure is fabricated but without the normal metal contacts that would be deposited to make for easier connections with the terminals of the device. In step 910 a layer of $Mo_xW_{1-x}$ is deposited on the source, drain and gate regions. This phase change material may be deposited by the concurrent deposition of Mo and W, or thin monolayers of each may be alternately deposited. The ratio of W to Mo may be controlled to establish the static phase at room temperature with no electric field applied. The application of an appropriate electrical field, e.g. such as by a voltage differential, to the phase change material will cause a phase change: metal to insulator, or insulator to metal. Useful ratios and corresponding X values in the formula have been discussed previously. In step 915 the layer of phase change material has deposited thereon Te such as by exposing the exposed surface of the phase change material to a vapor of Te at elevated temperature. Generally, Te deposited using temperatures between 400 and 600 degrees Centigrade result in a phase change material having an insulating state at room temperature operation and using temperatures between 650 and 1,100 degrees Centigrade result in a phase change material having a metal state at room temperature operation. In a final step 920, a layer of a metal is deposited on the phase change layers providing for source/drain/gate connection contacts.

Figure 10:
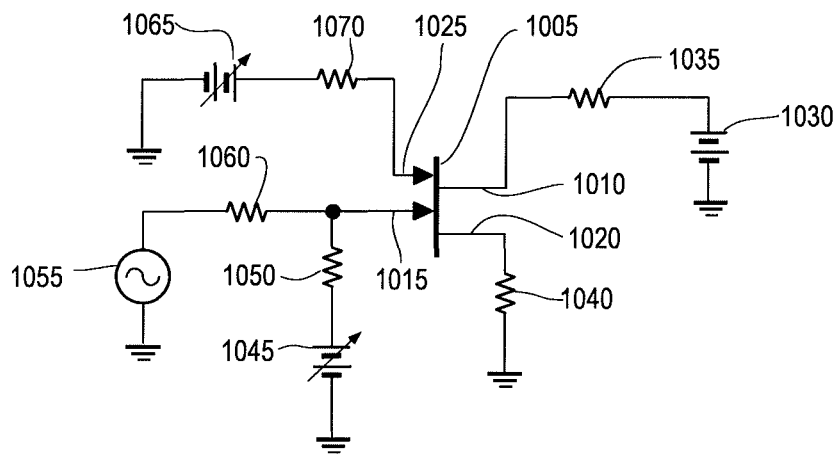
FIG. 10 is schematic diagram showing an exemplary circuit that can be used to supply a voltage differential that will produce a field sufficient to control the phase of the phase change material as used in an FET embodiment.

FIG. 10 shows a schematic diagram of exemplary circuitry that can be used to supply a voltage differential that will produce a field sufficient to control the phase of the phase change material as used in an FET 1005. The FET 1005 includes a drain 1010, gate 1015 and source 1020. An additional control gate/terminal 1025 is made of a phase change material as previously described herein. The gate 1025 is a schematic representation of element 735 as shown in FIG. 7. A DC voltage source 1030 supplies current to the drain 1010 through the load 1035, assuming that the FET 1005 is in an active/ON state. As will be appreciated, the drain current flows through the semiconducting channel of the FET and out of source 120 through circuit element 1040 to ground completing the circuit back to the voltage source 1030. A variable DC voltage source 1045 provides an operational gate voltage to the gate 1015 through isolating circuit element 1050. An AC signal source 1055 is coupled to the gate 1015 through isolating circuit element 1060. Depending upon the gain of FET 1005, the signal from the AC signal source 1055 will appear in an amplified magnitude at the drain 1010.

In accordance with an embodiment of the present invention, a variable DC voltage source 1065 is coupled through isolating circuit element 1070 to the additional control gate 1025 which is made of phase change material. The advantages of controlling the semiconducting and insulator phases of the phase change material of varying the voltage applied by the voltage source 1065 is explained with regard to FIG. 7 and FIG. 8. The DC voltage source 1065 has a sufficient voltage range to provide the predetermined phase change voltage level required to transition the phase change material between the metal and insulator phases.

Figure 11:
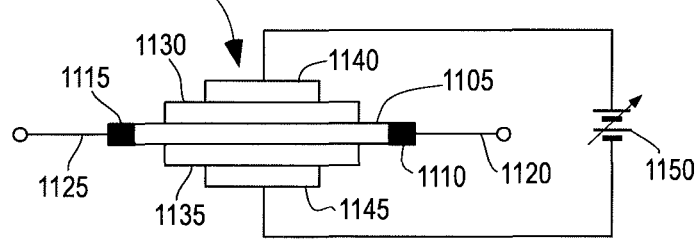
FIG. 11 is schematic diagram showing an exemplary circuit that can be used to supply a voltage differential that will produce a field sufficient to control the phase of the phase change material used as an ON/OFF semiconductor switch.

FIG. 11 shows a schematic diagram of an exemplary circuit that can be used to supply a voltage differential that will produce a field sufficient to control the phase of the phase change material used as an ON/OFF semiconductor switch 1100. In this exemplary embodiment, a channel 1105 is made of a phase change material as described herein. A metallic contact 1110 and 1115 are disposed at the respective ends of the channel 1105 to permit the attachment of connecting wires 1120 and 1125, respectively. The wires may be utilized to connect the ON/OFF semiconductor to other external circuitry (not shown) for which the flow of current is to be controlled by the switch 1100. Dielectric layers 1130 and 1135 are disposed on opposing lateral sides of the channel 1105. Metallic pads 1140 and 1145 are disposed respectively on the dielectric layers 1130 and 1135 to form a sandwich with the channel 1105. A variable DC voltage source 1150 is connected across the metallic pads 1140 and 1145 so that the DC voltage supplied by source 1150 creates a corresponding internal electric field that is induced upon the lateral sides of the channel 1105. As previously explained, the phase change material utilized for channel 1105 will, with no voltage applied by source 1150, be in one of a metal and insulator phase. With sufficient voltage applied by source 1150 to reach a predetermined phase change voltage level, the phase change material utilized for channel 1105 will transition to the other of the metal and insulator phases. Thus, the semiconductor switch 1100 can be controllably switched between an ON state when the channel 1105 is in the metal phase and an OFF state when the channel 1105 is in the insulator phase. As previously explained, the transition between ON/OFF states can be achieved in a shorter time frame than conventional switches based on silicon technology.

Although exemplary implementations of the invention have been depicted and described in detail herein, it will be apparent to those skilled in the art that various modifications, additions, substitutions, and the like can be made without departing from the spirit of the invention.

The scope of the invention is defined in the following claims.

The invention claimed is:

1. A field effect transistor (FET) comprising:
a semiconducting channel;
spaced apart source and drain regions disposed on a surface of the semiconducting channel;
a dielectric layer disposed on the surface of the semiconducting channel between the source and drain regions;
a gate region disposed on a surface of the dielectric layer opposite the surface of the semiconducting channel, the gate region disposed between the source and drain regions;
the source, gate and drain regions each comprising $Mo_xW_{1-x}Te_2$ phase change material, the phase change material changes from one of metal and insulator phases to the other of metal and insulator phases at room temperature dependent on whether a voltage differential greater than a predetermined phase change voltage exists across the phase change material;
metal contacts disposed on each of the source, gate and drain regions to facilitate electrical connections with the source, gate and drain regions.

2. The FET of claim 1 wherein the x in the material composition formula is a positive number less than or equal to 1.0, the value of x differing for the material utilized in the source and gate regions with the source region having a lower x value than the x value for the gate region.

3. The FET of claim 2 wherein the value of x in the material composition formula for the respective regions is as follows:
for the source region, $0.7<x<0.8$,
for the gate region, $0.9<x<1.0$,
for the drain region, $0.9<x<1.0$.

4. A field effect transistor (FET) comprising:
a semiconducting channel;
spaced apart source and drain regions disposed on a surface of the semiconducting channel;
a dielectric layer disposed on the surface of the semiconducting channel between the source and drain regions;
a gate region disposed on a surface of the dielectric layer opposite the surface of the semiconducting channel and between the source and drain regions;
the source, gate and drain regions each being a metallic region;
a control region disposed on the surface of the dielectric layer between the gate region and the drain region, the control region comprising $Mo_xW_{1-x}Te_2$ phase change material which has a semiconductor phase and an insulator phase selectable based on whether a control voltage field is or is not present across the control region, the phase change material remaining at room temperature during the change from one of metal and insulator phases to the other of metal and insulator phases;
the control region in the semiconductor phase passivating traps at the surface of the semiconducting channel between the gate region and the drain region;
the control region in the insulator phase not presenting a physically active region adjacent the gate region, wherein high frequency response of the FET is enhanced.

5. The FET of claim 4 wherein the x in the material composition formula is a positive number less than or equal to 1.0, the value of x being between xx and yy.

6. The FET of claim 4 wherein the gate region and the control region do not abut each other and are spaced apart.

7. The FET of claim 4 wherein the gate region and the control region abut each other and are electrically connected to each other.

* * * * *